US011921550B2

(12) United States Patent
Li et al.

(10) Patent No.: US 11,921,550 B2
(45) Date of Patent: Mar. 5, 2024

(54) CIRCUIT BOARD, DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Fan Li, Beijing (CN); Qiang Tang, Beijing (CN); Lianbin Liu, Beijing (CN); Yunhan Xiao, Beijing (CN); Xiaolong Zhu, Beijing (CN); Hengzhen Liang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 218 days.

(21) Appl. No.: 17/512,628

(22) Filed: Oct. 27, 2021

(65) Prior Publication Data
US 2022/0300045 A1     Sep. 22, 2022

(30) Foreign Application Priority Data

Mar. 22, 2021   (CN) .......................... 202120581202.5

(51) Int. Cl.
H05K 1/18     (2006.01)
G06F 1/18     (2006.01)
H05K 1/11     (2006.01)

(52) U.S. Cl.
CPC .............. *G06F 1/183* (2013.01); *H05K 1/111* (2013.01); *H05K 1/182* (2013.01); *H05K 2201/10128* (2013.01)

(58) Field of Classification Search
CPC ........ G06F 1/183; H05K 1/111; H05K 1/182; H05K 2201/10128
USPC ...................................................... 361/679.01
See application file for complete search history.

(56) References Cited

U.S. PATENT DOCUMENTS

| | | | | |
|---|---|---|---|---|
| 2014/0302692 A1* | 10/2014 | Raff | ..................... | H01R 12/716 439/65 |
| 2018/0063955 A1* | 3/2018 | Werley | ................... | H05K 3/328 |
| 2018/0122889 A1* | 5/2018 | Kim | ...................... | G06F 3/0416 |

* cited by examiner

*Primary Examiner* — Binh B Tran
(74) *Attorney, Agent, or Firm* — Ling Wu; Stephen Yang; Ling and Yang Intellectual Property

(57) ABSTRACT

A circuit board, a display panel and a display apparatus are provided. The circuit board includes a main circuit board and an adapter circuit board stacked on the main circuit board. The adapter circuit board is provided with at least one first pad region, and the first pad region includes a hollowed region penetrating through the adapter circuit board and multiple first pads distributed around the hollowed region. The main circuit board is provided with at least one second pad region including multiple second pads, and the first pads of each of the first pad regions are respectively soldered to the multiple second pads of a corresponding second pad region.

18 Claims, 7 Drawing Sheets

CIRCUIT BOARD, DISPLAY PANEL AND DISPLAY APPARATUS

CROSS-REFERENCE TO RELATED APPLICATION

The present application claims priority of Chinese Patent Application No. 202120581202.5 filed to the CNIPA on Mar. 22, 2021, the content of which is incorporated herein by reference.

TECHNICAL FIELD

Embodiments of the disclosure relate, but are not limited, to the technical field of display, and more particularly to a circuit board, a display panel and a display apparatus.

BACKGROUND

At present, some Flexible Printed Circuit board (FPC) in touch display modules with Flexible Multi-Layer On Cell (FMLOC) structure adopt a design solution of multiple layers of soft and hard boards, which is difficult to design compared with two-layer boards commonly used in the industry, and the manufacturing processes are complicated, there are a few corresponding domestic manufacturers with limited technical capabilities. At present, supply channels of multilayer boards are mainly foreign manufacturers, resulting in long delivery time, high costs, which is not convenient for flexible operation of projects.

In addition, some flexible printed circuit boards adopt a two-layer board bridging solution, that is, a solution of soldering an adapter circuit board on a main circuit board. However, this solution has problems such as void soldering and voids in the underfill.

SUMMARY

The following is a summary of the subject matters described in the present disclosure in detail. The summary is not intended to limit the scope of protection of the claims.

An embodiment of the disclosure provides a circuit board, including a main circuit board and an adapter circuit board stacked on the main circuit board; the adapter circuit board is provided with at least one first pad region, and a first pad region includes a hollowed region penetrating through the adapter circuit board and multiple first pads distributed around the hollowed region; and the main circuit board is provided with at least one second pad region including multiple second pads, and the distributed first pads of each first pad region are respectively soldered to the multiple second pads of a corresponding second pad region.

In an exemplary embodiment, each first pad is provided with a solder hole penetrating through the adapter circuit board and filled with solder, and the solder connects the first pads and the second pads.

In an exemplary embodiment, the multiple first pads surrounding the first pad region on the main circuit board are provided with a first underfill, a second underfill is provided in the hollowed region along a circumferential edge of the hollowed region, and both the first underfill and the second underfill are partially filled between the adapter circuit board and the main circuit board.

In an exemplary embodiment, a shape of the hollowed region is rectangular, circular or elliptical.

In an exemplary embodiment, a shape formed by in the hollowed region of the multiple first pads in the first pad region is the same as the shape of the hollowed region.

In an exemplary embodiment, the adapter circuit board includes a first underlay substrate and a first wiring layer and a second wiring layer respectively disposed on two sides of the first underlay substrate, wherein the first wiring layer includes multiple first sub-pads, the second wiring layer includes multiple second sub-pads having positions corresponding to positions of the first sub-pads, and the first pads include the first sub-pads and the second sub-pads which are connected through via holes plated with a conductive layer, wherein the via holes are the solder holes.

In an exemplary embodiment, the adapter circuit board is provided with a first lead group including multiple first leads extending along a first direction; the main circuit board is provided with a second lead group including multiple second leads extending along a second direction, wherein the first direction intersects with the second direction; an orthographic projection of the multiple first leads on the main circuit board intersects with an orthographic projection of the multiple second leads on the main circuit board.

In an exemplary embodiment, the adapter circuit board is provided with two first pad regions, each of the first leads connects two first pads located in the two first pad regions respectively, and the main circuit board is provided with two second pad regions corresponding to the two first pad regions respectively;

the main circuit board is further provided with a first device overlap region and a first external pin region, wherein the first external pin region includes a first sub-external pin group, a second sub-external pin group and a third sub-external pin group, wherein each sub-external pin group includes multiple first external pins, and the first device overlap region includes multiple first overlap pins; and the circuit board is provided with a first signal lead group including multiple first signal leads, each of the first signal leads includes a third lead, the first lead and a fourth lead which are connected in sequence, wherein two ends of the third lead are respectively connected with a first external pin of the first sub-external pin group and a second pad of one of the two second pad regions, and two ends of the fourth lead are respectively connected to a second pad of the other one of the two second pad regions and a first overlap pin.

In an exemplary embodiment, the first device overlap region further includes multiple second overlap pins, the circuit board is further provided with a second signal lead group including multiple second signal leads, and two ends of a second signal lead are respectively connected with a first external pin of the second sub-external pin group and a second overlap pin.

In an exemplary embodiment, the main circuit board is further provided with a second external pin region including multiple second external pins, and the second leads are connected with the first external pins of the third sub-external pin group and the second external pins.

In an exemplary embodiment, the main circuit board is further provided with a second device overlap region, and part of the second leads in the second lead group are further connected with the second device overlap region.

An embodiment of the disclosure further provides a display panel, which includes a display substrate and any of the above circuit boards, and the circuit board is bond and connected with the display substrate.

An embodiment of the present disclosure further provides a display apparatus which includes any one of the above display panels.

Other aspects will become apparent upon reading and understanding the drawings and the detailed description.

BRIEF DESCRIPTION OF DRAWINGS

The drawings provide a further understanding of technical solutions of the present disclosure, form a part of the specification, and are used to explain, together with the embodiments of the present disclosure, the technical solutions of the present disclosure and not intended to form limitations on the technical solutions of the present disclosure.

FIG. 3b is a partial cross-sectional structural diagram of soldering positions of a first pad and a second pad of the circuit board in FIG. 3a.

DETAILED DESCRIPTION

Specific implementations of the present disclosure will be described further in detail below with reference to the accompanying drawings and embodiments. The following embodiments serve to illustrate the present disclosure, but are not intended to limit the scope of the present disclosure. Those skilled in the art should understand that modifications or equivalent replacements of the technical solution of the present disclosure may be made without departing from the essence and scope of the technical solution of the present disclosure, which, however, should be all included in the scope of the claims of the present disclosure. The embodiments and features in the embodiments in the present disclosure may be combined with each other randomly if there is no conflict.

Figure 1:
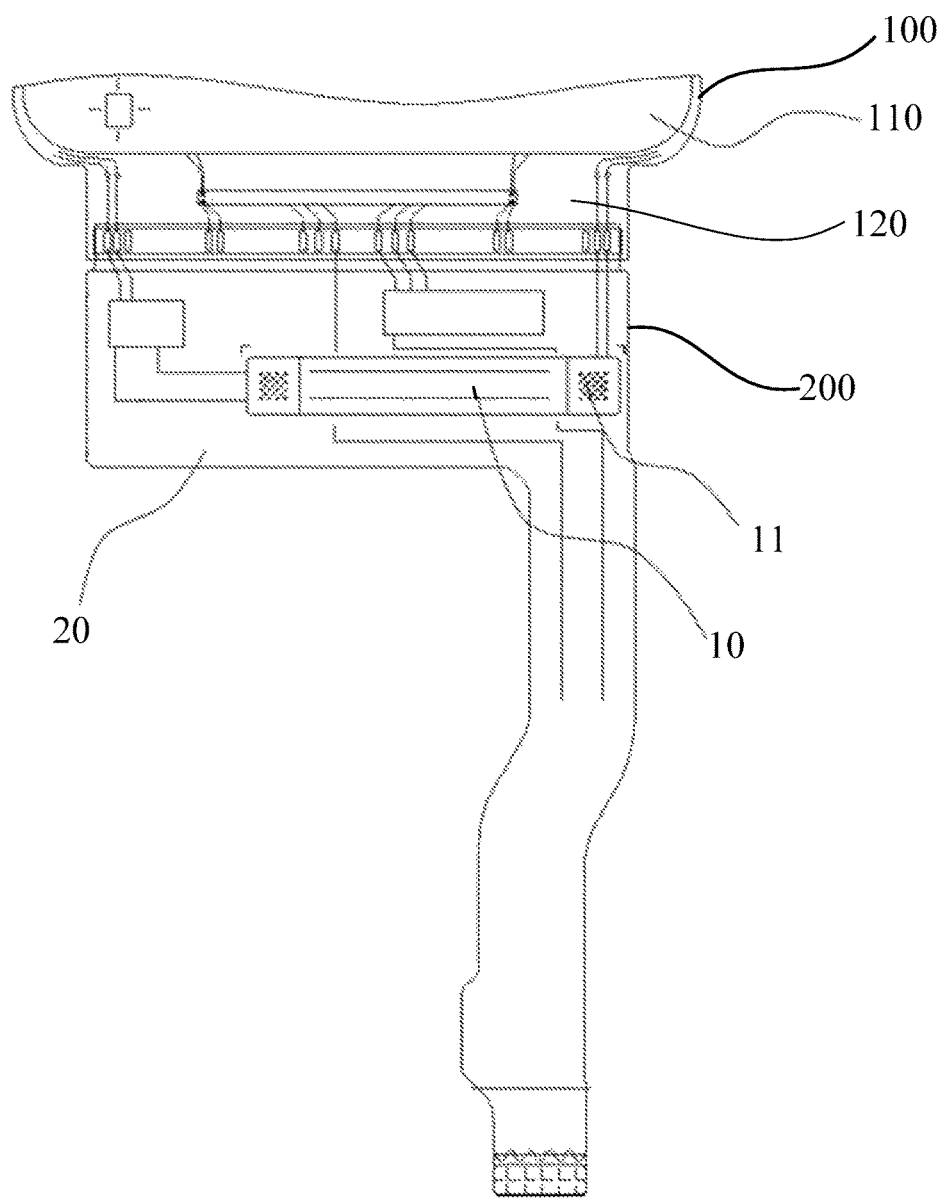
FIG. 1 is a schematic diagram of a structure of a circuit board adopting a two-layer board bridging solution in a display panel in some exemplary embodiments.
Figure 2A:
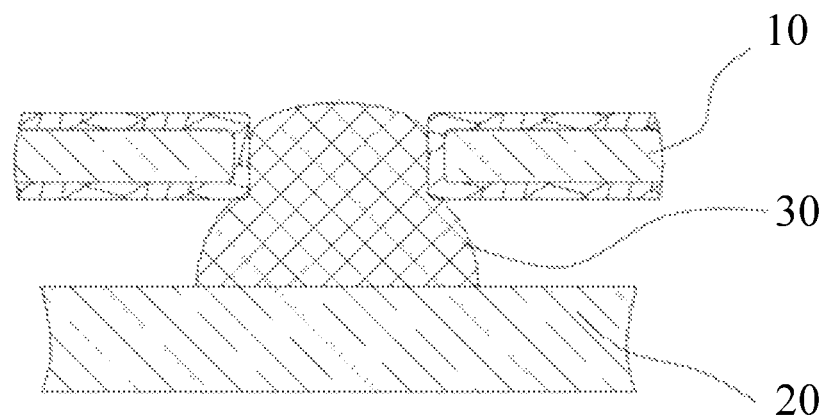
FIG. 2a is a structural schematic diagram showing that solder joints of an adapter circuit board and a main circuit board of a circuit board in some exemplary embodiments are in a normal soldering state.
Figure 2B:
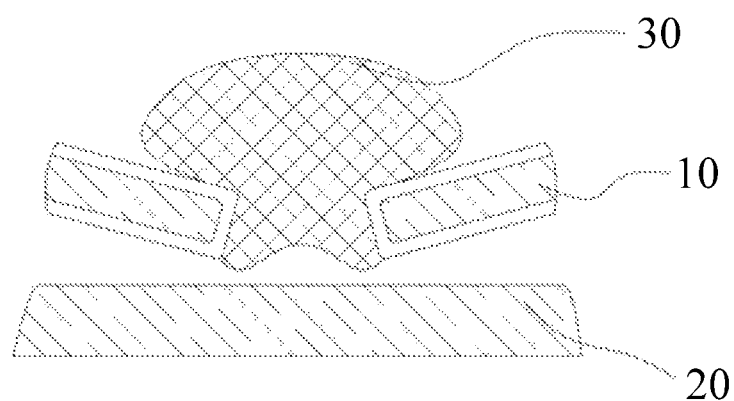
FIG. 2b is a structural schematic diagram showing that solder joints between an adapter circuit board and a main circuit board of some circuit boards are in a void soldering state.
Figure 2C:
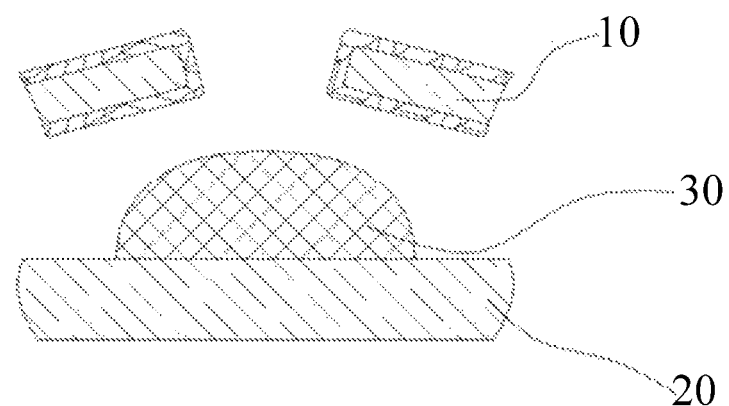
FIG. 2c is a structural schematic diagram showing that solder joints between an adapter circuit board and a main circuit board of some circuit boards are in another void soldering state.
Figure 3A:
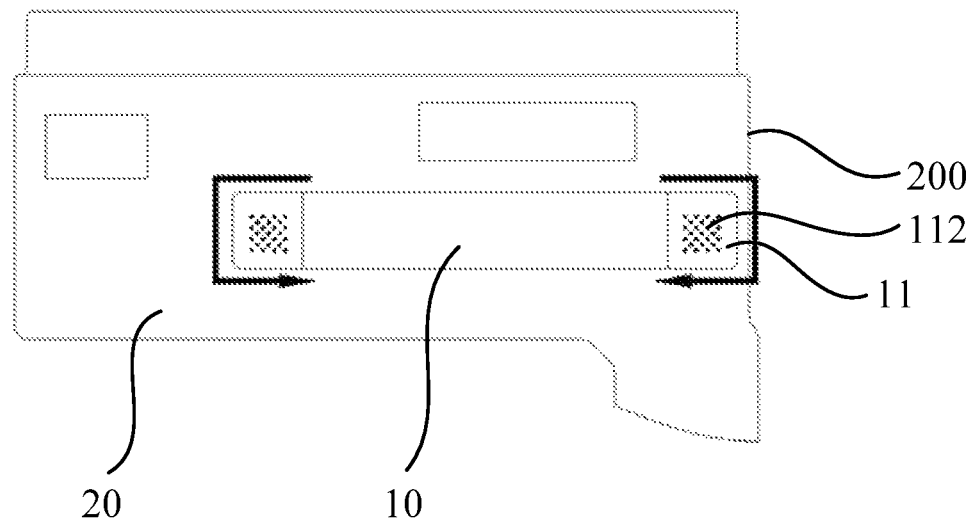
FIG. 3a is a schematic diagram of a coating path of an underfill for some circuit boards.
Figure 3B:
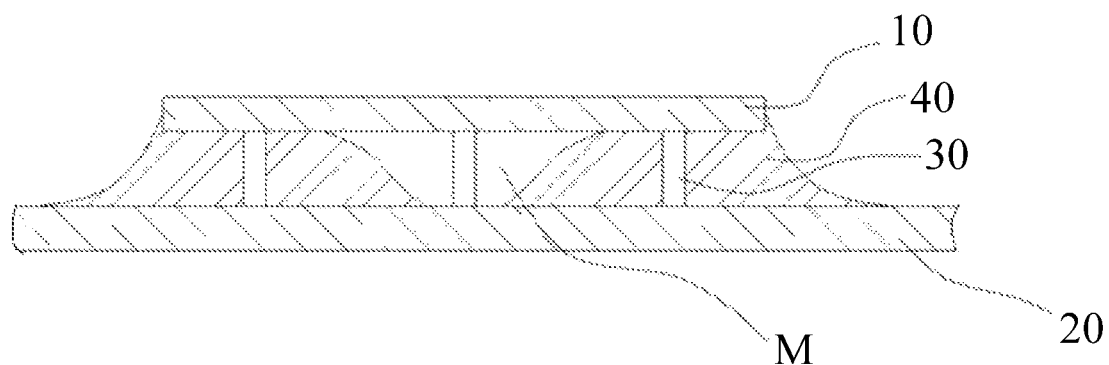

As shown in FIG. 1, FIG. 1 is a schematic diagram of a structure of a circuit board adopting a two-layer board bridging solution in a display panel of some exemplary embodiments. The display panel includes a display substrate 100 and a circuit board 200. The display substrate 100 includes a display region 110 and a bonding region 120 located at one side of the display region 110, wherein the circuit board 200 is bond and connected with the bonding region 120. The circuit board 200 includes a main circuit board 20 and an adapter circuit board 10 stacked on the main circuit board 20. The adapter circuit board 10 is provided with at least one first pad region 11, and the first pad region 11 (referred to as ball grid array pads, or BGA PAD for short) includes multiple first pads. The main circuit board 20 is provided with at least one second pad region including multiple second pads. The multiple first pads of the first pad region 11 and the multiple second pads of the second pad region are respectively soldered correspondingly to connect the transfer adapter circuit board 10 with the main circuit board 20. In some soldering methods, a first pad is provided with a solder hole penetrating through the adapter circuit board 10. In a process of soldering the adapter circuit board 10 with the main circuit board 20, a solder 30 (such as soldering tin) filled in the solder hole of the first pad 112 melts and the first pad is soldered to a second pad, as shown in FIG. 2a. FIG. 2a shows a normal state of a solder joint. However, in a process of soldering (such as reflow soldering), pads in a central region of the first pad region 11 are prone to deformation (convex or concave) by heat, which leads to the problem of void soldering as shown in FIG. 2b or FIG. 2c. In FIG. 2b and FIG. 2c, the solder 30 does not solder the first pads of the adapter circuit board 10 to the second pad of the main board 20. In addition, in some technologies, after the adapter circuit board 10 is soldered to the main circuit board 20. In order to improve the impact resistance (thermal shock, mechanical shock or vibration, etc.) performance of the soldering positions and prevent corrosion, short circuit or mechanical failure of the soldering positions, an underfill is coated around the first pad region 11 between the adapter circuit board 10 and the main circuit board 20, as shown in FIG. 3a. FIG. 3a is a schematic diagram of a coating path of an underfill for some circuit boards, wherein a broken line with an arrow in FIG. 3a represents the coating path of the underfill. As the underfill is coated along a circumferential direction of the first pad region 11, the problem of insufficient overflow of the underfill to the central region of the first pad region 11 will occur, which will easily lead to defects such as voids in the central region of the first pad region 11, as shown in FIG. 3b. FIG. 3b is a structural diagram of voids generated by the underfill. The voids M produced by the underfill 40 will cause problems such as poor impact resistance performance, corrosion, short circuit or mechanical failure at the soldering positions.

Figure 4:
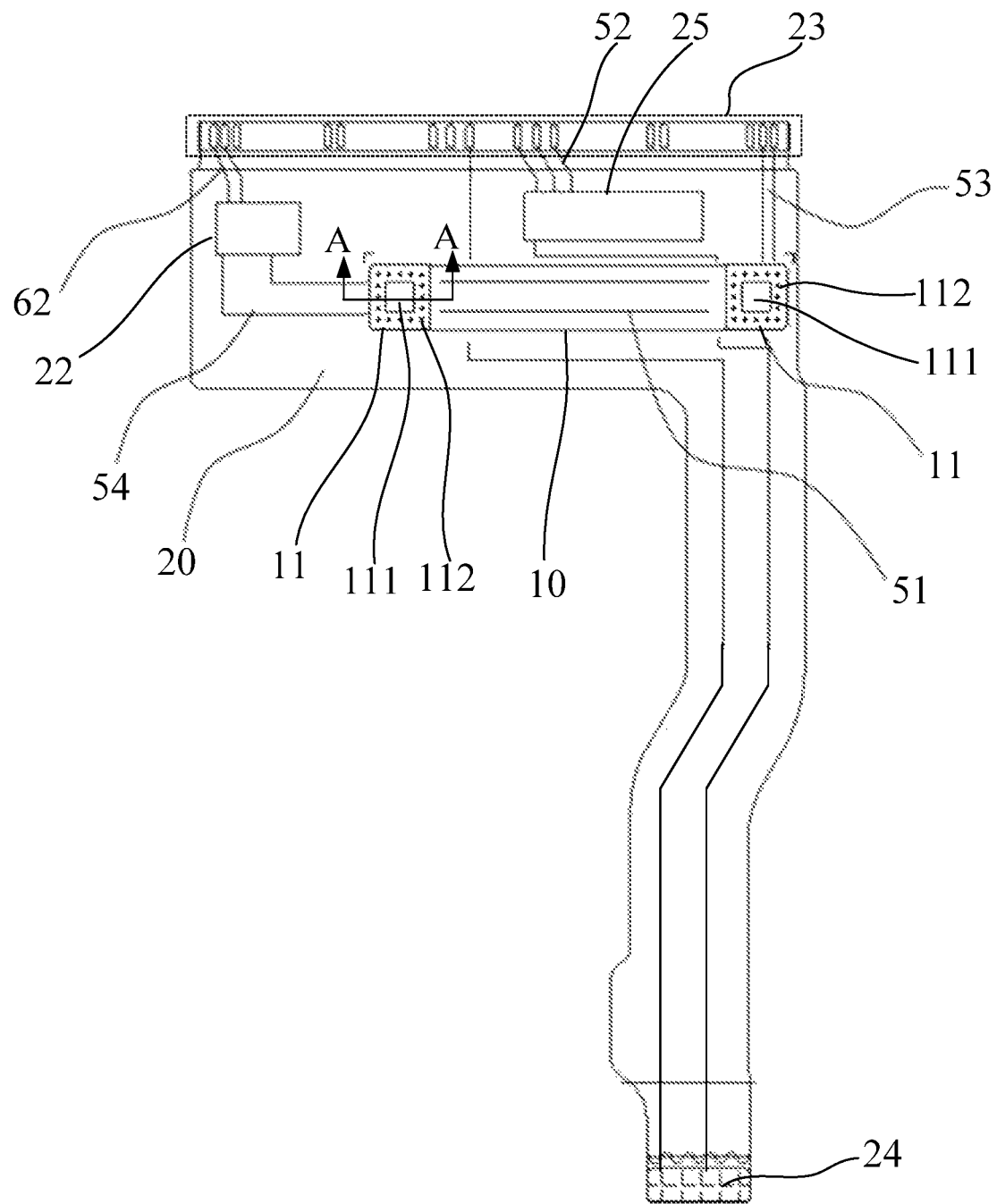
FIG. 4 is a plane view of a structure of a circuit board in some exemplary embodiment of the present disclosure.
Figure 5A:
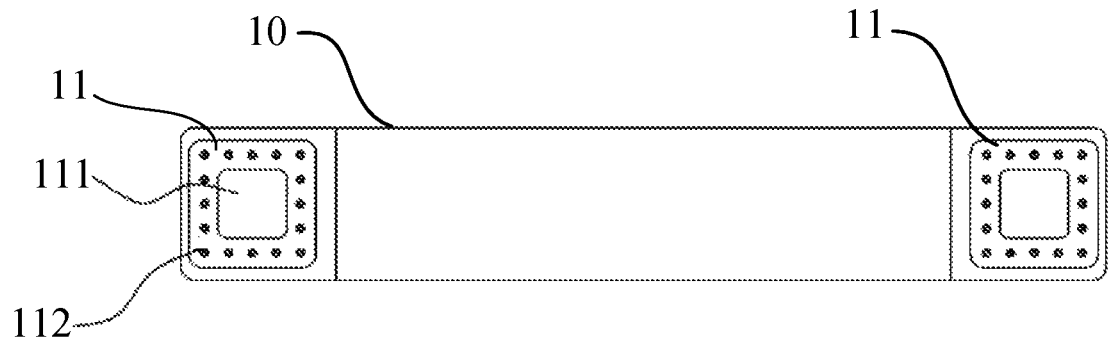
FIG. 5a is a schematic plane view of a structure of an adapter circuit board of a circuit board in some exemplary embodiments.
Figure 7:
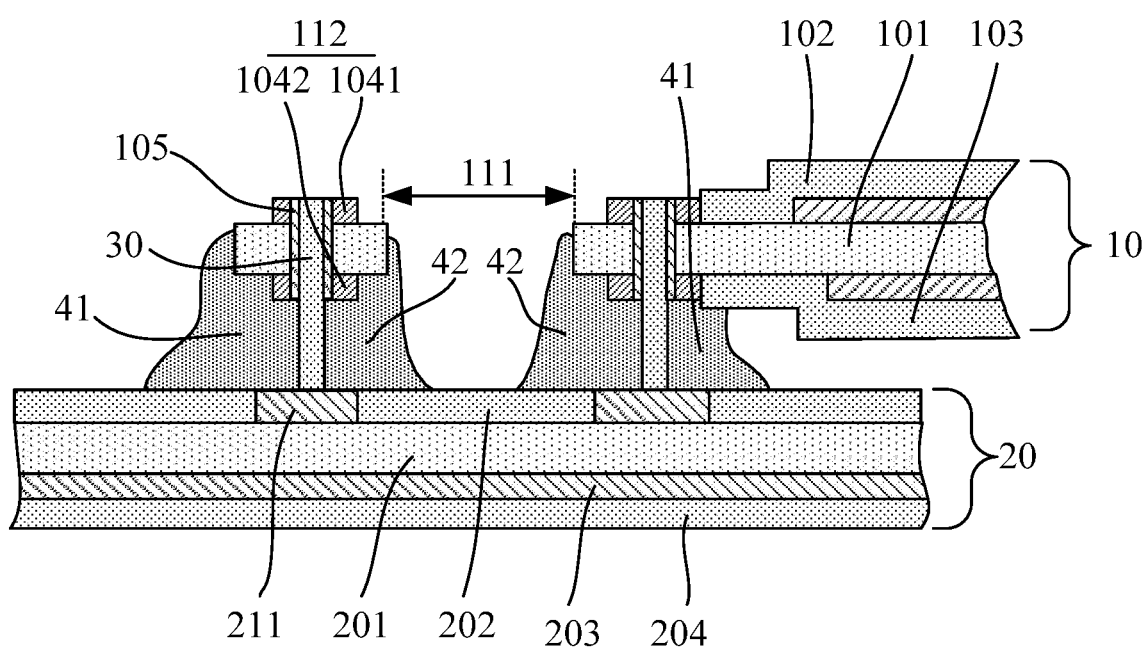
FIG. 7 is a schematic diagram of an A-A cross-sectional structure in FIG. 4 in some exemplary embodiments.

An embodiment of the present disclosure provides a circuit board, as shown in FIG. 4, FIG. 5a and FIG. 7. FIG. 4 is a plane view of a structure of a circuit board in some exemplary embodiment of the present disclosure. FIG. 5a is a schematic plane view of a structure of an adapter circuit board of a circuit board in some exemplary embodiments. FIG. 7 is a schematic diagram of an A-A cross-sectional structure in FIG. 4 in some exemplary embodiments. The circuit board includes a main circuit board 20 and an adapter circuit board 10 stacked on the main circuit board 20. The adapter circuit board 10 is provided with at least one first pad region 11, wherein a first pad region 11 includes a hollowed region 111 penetrating through the adapter circuit board 10 and multiple first pads 112 distributed around the hollowed region 111. The main circuit board 20 is provided with at least one second pad region, wherein a second pad region includes multiple second pads 211, and the first multiple pads of each first pad region 11 are respectively soldered to the multiple second pads 211 of one corresponding second pad region 112.

In the circuit board of this embodiment, the hollowed region 111 is provided in the first pad region 11 of the adapter circuit board 10, and multiple first pads 112 of the first pad region 11 are distributed around the hollowed region 111. Thus, in a process of soldering the multiple first pads 112 of the first pad region 11 to multiple second pads 211 of the second pad region on the main circuit board 20, the hollowed region 111 is provided in the first pad region 11. In this way, a region where the multiple first pads 112 of the first pad region 11 are located is not prone to high-temperature deformation. Therefore, the problem of void soldering will not easily occur during the soldering process, thus the soldering quality can be improved.

In some exemplary embodiments, the first pad 112 is provided with a solder hole penetrating through the adapter circuit board 10 and a solder 30 is filled in the solder hole, wherein the solder 30 connects the first pad 112 and the second pad 211. In an example of this embodiment, as shown in FIG. 7, the adapter circuit board 10 includes a first underlay substrate 101 and a first wiring layer and a second wiring layer respectively disposed on two sides of the first underlay substrate 101. The first wiring layer includes multiple first sub-pads 1041, the second wiring layer includes multiple second sub-pads 1042 having positions corresponding to those of the multiple first sub-pads 1041. The first pads 112 include the first sub-pads 1041 and the second sub-pads 1042 connected through via holes plated with a conductive layer 105, wherein the via holes are the solder holes. The adapter circuit board 10 may further include a first covering layer 102 disposed on a surface of the first wiring layer facing away from the first underlay substrate 101 and a second covering layer 103 disposed on a surface of the second wiring layer facing away from the first underlay substrate 101, wherein the first covering layer 102 exposes the multiple first sub-pads 1041 and the second covering layer 103 exposes the multiple second sub-pads 1042. Materials of the conductive layer 105 and the first wiring layer and the second wiring layer may all be copper. Exemplarily, the main circuit board 20 may include a second underlay substrate 201, a third wiring layer and a fourth wiring layer 203 respectively disposed on two sides of the second underlay substrate 201, and a third covering layer 202 disposed on a surface of the third wiring layer facing away from the second underlay substrate 201 and a fourth covering layer 204 disposed on a surface of the fourth wiring layer 203 facing away from the second underlay substrate 201. The third wiring layer includes the multiple second pads 211 of the second pad region, and the third covering layer 202 exposes the multiple second pads 211. The positions of the multiple second pads 211 in the second pad region and the positions of the multiple first pads 112 in the first pad region 11 may be disposed in one-to-one correspondence. In other examples, the adapter circuit board 10 may include one wiring layer including the multiple first pads 112, and the wiring layer of the main circuit board 20 may have more than two layers.

Figure 6:
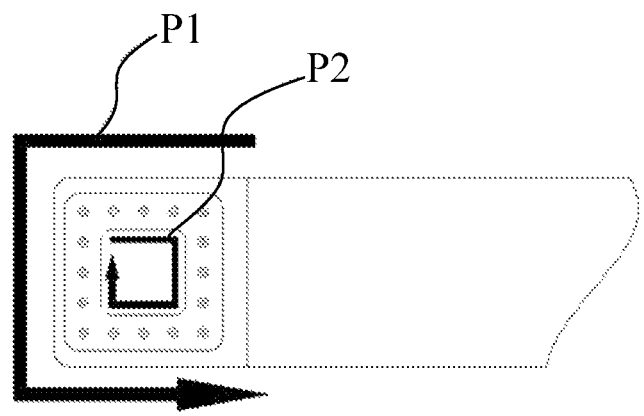
FIG. 6 is a schematic diagram of coating paths of a first underfill and a second underfill in some exemplary embodiments.

In some exemplary embodiments, as shown in FIG. 7, the multiple first pads 112 surrounding the first pad region 11 on the main circuit board 20 are provided with first underfill 41, second underfill 42 is provided along the circumferential edge of the hollowed region 111, and both the first underfill 41 and the second underfill 42 are partially filled between the adapter circuit board 10 and the main circuit board 20. As shown in FIG. 6, FIG. 6 is a schematic diagram of the coating paths of the first underfill 41 and the second underfill 42 in some exemplary embodiments, in which a broken line with arrow indicated by P1 represents a spot coating path of the first underfill 41 and a broken line with arrow indicated by P2 represents a spot coating path of the second underfill 42. In this embodiment, the second underfill 42 is disposed along the circumferential edge of the hollowed region 111, so that the first underfill 41 may sufficiently overflow from the side of the multiple first pads 112 away from the hollowed region 111 to the positions of the solder joints (soldering positions) between the main circuit board 20 and the adapter circuit board 10 in a process of coating the first underfill 41 and the second underfill 42. The second underfill 42 may sufficiently overflow from the side of the first pads 112 near the hollowed region 111 to the solder joint position (soldering position) between the main circuit board 20 and the adapter circuit board 10, so that the first underfill 41 and the second underfill 42 may surround the positions of the solder joints between the main circuit board 20 and the adapter circuit board 10, which is less prone to void phenomenon and improves the reliability of the positions of the solder joints.

Figure 5B:
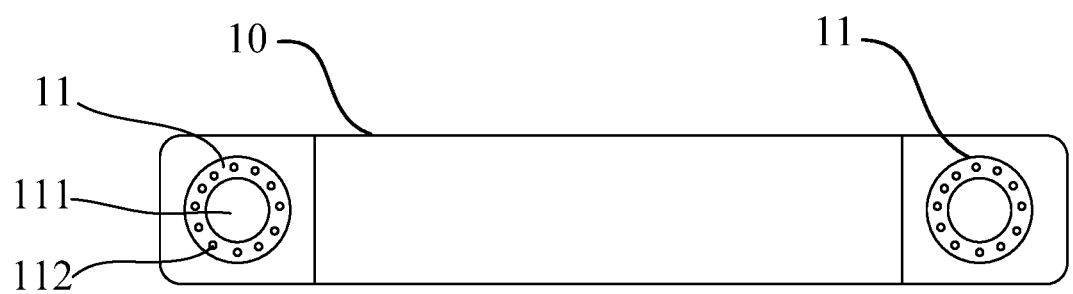
FIG. 5b is a schematic plane view of a structure of an adapter circuit board of a circuit board in some other exemplary embodiments.

In some exemplary embodiments, the shape of the hollowed region 111 is rectangular, circular or elliptical, and the shape formed by the arrangement of the multiple first pads 112 in the first pad region 11 may be the same as the shape of the hollowed region 111. For example, as shown in FIG. 5a, the hollowed region 111 is square in shape, and multiple first pads 112 are distributed at intervals around the square hollowed region 111 and are distributed to form a square. In another example of this embodiment, as shown in FIG. 5b, FIG. 5b is a schematic plan view of a structure of the adapter circuit board 10 of another example, the hollowed region 111 is circular in shape, in which hollowed region 111 is circular and multiple first pads 112 are disposed at intervals around the circular hollowed region 111 and distributed to form a circle. In this example, the hollowed region 111 is circular, which is conducive to ensuring the uniformity of the width from the multiple first pads 112 distributed in the circumferential direction of the hollowed region 111 to the circumferential edge of the hollowed region 111. In the process of coating the second underfill 42, it helps the second underfill 42 to overflow evenly to positions every solder joints in the circumferential direction of the hollowed region 111, and the problem of voids will not easily occur.

In some exemplary embodiments, as shown in FIG. 4, the adapter circuit board 10 is provided with a first lead group, and the first lead group includes multiple first leads 51 extending along a first direction. The main circuit board 20 is provided with a second lead group, and the second lead group includes multiple second leads 52 extending along a second direction, wherein the first direction intersects with the second direction. An orthographic projection of the multiple first leads 51 on the main circuit board 20 intersects with an orthographic projection of the multiple second leads 52 on the main circuit board 20.

In an example of this embodiment, as shown in FIG. 4, the adapter circuit board 10 may be provided with two first pad regions 11, wherein each of the first leads 51 connects two first pads 112 located in the two first pad regions 11 respectively, and the main circuit board 20 is provided with two second pad regions corresponding to the two first pad regions 11 respectively. An orthographic projection of the two first pad regions 11 on the main circuit board 20 may be located on two sides of the second lead group in the first direction.

The main circuit board 20 is further provided with a first device overlap region 22 and a first external pin region 23. The first external pin region 23 includes a first sub-external pin group, a second sub-external pin group and a third sub-external pin group. Each sub-external pin group includes multiple first external pins. The first external pins of the first external pin region 23 may be disposed at intervals in a direction parallel to the first direction, and the third sub-external pin group may be located between the first sub-external pin group and the second sub-external pin group. The first device overlap region 22 includes multiple first overlap pins.

The circuit board is provided with a first signal lead group including multiple first signal leads, each of the first signal leads includes a third lead 53, the first lead 51 and a fourth lead 54 which are connected in sequence, wherein two ends of the third lead 53 are respectively connected with a first external pin of the first sub-external lead group and a second pad 211 of one of the two second pad regions, and two ends of the fourth lead 54 are respectively connected to a second pad 211 of the other one of the two second pad regions and the first overlap pin. In this example, the third lead 53 and the fourth lead 54 of the first signal lead are both located on the main circuit board 20, and the first lead 51 is located on the adapter circuit board 10. The third lead 53 and the fourth lead 54 may be located on two sides of the second lead group 52 in the first direction, respectively. By arranging the first lead 51 on the adapter circuit board 10 to cross the second lead group 52 on the main circuit board 20, it is not necessary to additionally provide a wiring layer on the main circuit board 20 for the arrangement of the first lead 51, which can reduce the number of wiring layers of the main circuit board 20 and the manufacturing costs of the main circuit board 20.

In some exemplary embodiments, as shown in FIG. 4, the first device overlap region 22 may further include multiple second overlap pins, the circuit board may be further provided with a second signal lead group including multiple second signal leads 62, and two ends of each second signal lead 32 are respectively connected with a first external pin of the second sub-external pin group and a second overlap pin.

In some exemplary embodiments, as shown in FIG. 4, the main circuit board 20 may be further provided with a second external pin region 24 including multiple second external pins, wherein the second leads 52 are connected with the first external pins of the third sub-external pin group and the second external pins. In an example of this embodiment, the main circuit board 20 may be further provided with a second device overlap region 25, and part of the second leads 52 in the second lead group 52 are also connected with the second device overlap region 25.

An embodiment of the present disclosure further provides a display panel, which includes a display substrate 100 and the circuit board described in any of the previous embodiments, and the circuit board is bond and connected with the display substrate 100.

Figure 8:
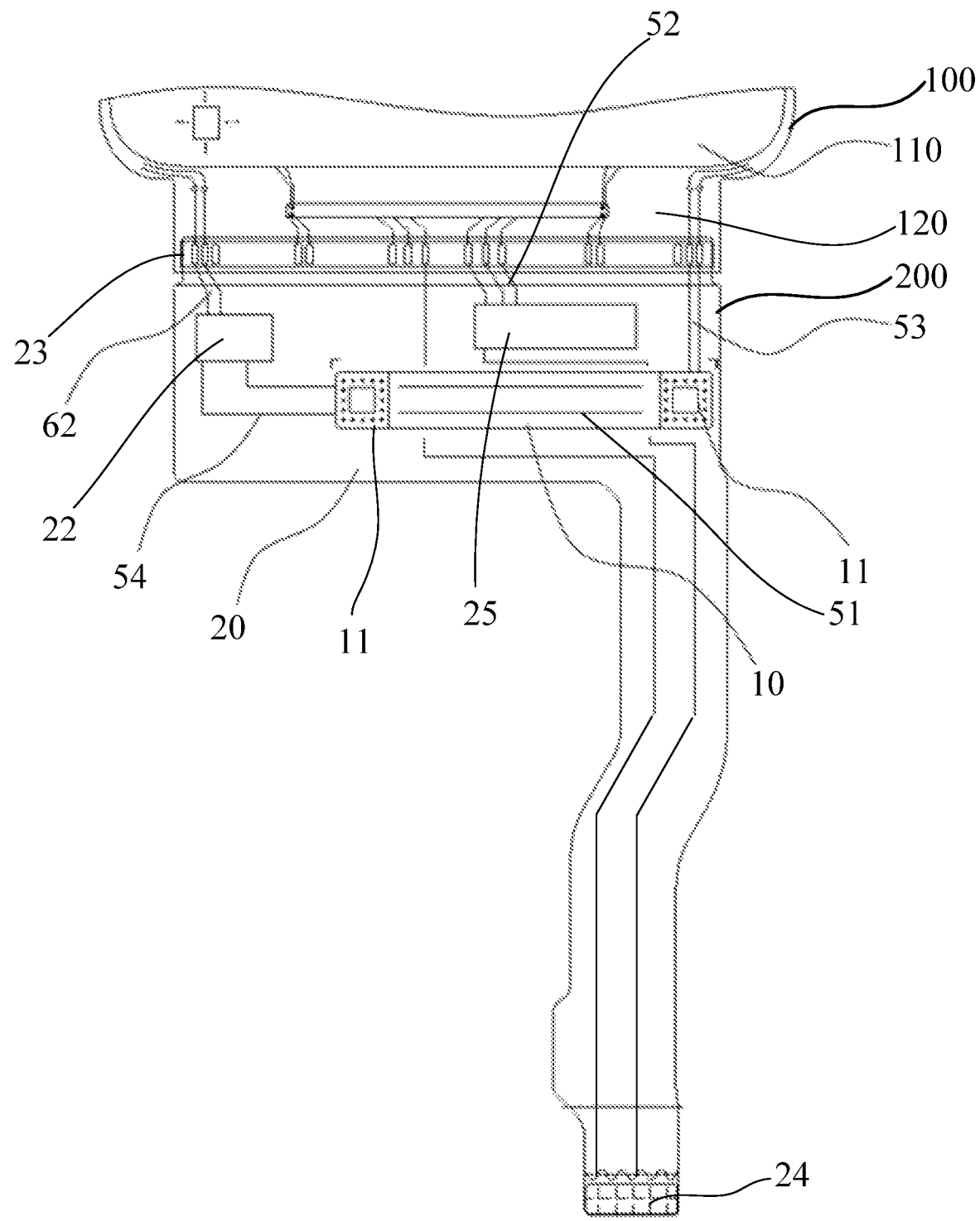
FIG. 8 is a plane view of a structure of a display panel in some exemplary embodiment of the present disclosure.

In an example of this embodiment, as shown in FIG. 8, FIG. 8 is a schematic plane view of a structure of a display panel in some exemplary embodiment of the present disclosure. The display panel includes a display substrate 100 and a circuit board 200. The display substrate 100 includes a display region 110 and a bonding region 120 located at one side of the display region 110, and the circuit board 200 is bond and connected with the bonding region 120 of the display substrate 100 through a first external pin region 23. The display panel may be a touch display panel with a touch control function, for example, the display panel may be an OLED touch display panel with an FMLOC structure, and the display substrate 100 includes a display drive circuit layer and a touch drive circuit layer. The first signal lead of the circuit board 200 may be configured to transmit a first touch signal, the second signal lead 62 may be configured to transmit a second touch signal, and the second lead 52 may be configured to transmit display related signals. For example, the first signal lead may be a driving electrode lead connected with a driving electrode (Tx) of the touch drive circuit layer of the display substrate 100, the second signal lead 62 may be a sensing electrode lead connected with a sensing electrode (Rx) of the touch drive circuit layer of the display substrate 100, and the second lead 52 may be a data lead connected to the data line of the display drive circuit layer of the display substrate 100. The first device overlap region 22 of the main circuit board 20 may be bonded to a touch-related chip, the second device overlap region 25 may be bonded to a display-related chip, and the second external pin region 24 may be configured to be connected to the main control board of the display apparatus. The circuit board in the display panel of this embodiment may replace the multiple layers of circuit boards in some touch display panels, thus saving costs.

An embodiment of the disclosure further provides a display apparatus, including the display panel as described above. The display apparatus may be any product or component with a display function such as a mobile phone, a tablet computer, a television, a monitor, a laptop, a digital frame, or a navigator, etc.

In the description of the present disclosure, "parallel" refers to a state that an angle formed by two straight lines is above −10° and below 10°, and thus may also include a state that the angle is above −5° and below 5°. In addition, "vertical" refers to a state where two straight lines form an angle above 80° and below 100°, and thus includes a state where the angle is above 85° and below 95°.

In the description herein, orientation or positional relations indicated by terms including "on", "under", "left", "right", "upper", "inside", "outside", "axial direction", "four corners" and the like are based on the orientation or positional relations shown in the drawings, and are for an easy and brief description of the present disclosure and are not intended to indicate or imply that the mentioned structures must have a specific orientation, or be constructed and operated in a particular orientation, and therefore these expressions should not be construed as limitation to the present disclosure.

In the description herein, the terms "connection", "fixed connection", "installation" and "assembly" are to be understood broadly, for example, a connection may be fixed connection, or they may be detachable connection, or may be an integral connection, unless explicitly specified and limited otherwise. The terms "installation", "connection" and "fixed connection" may be directly connected, or may be indirectly connected through an intermediate medium, or may be an internal connection between two elements. Those of ordinary skills in the art can understand the specific meanings of the above mentioned terms in the present disclosure according to specific context.

What is claimed is:
1. A circuit board, comprising: a main circuit board and an adapter circuit board stacked on the main circuit board;
the adapter circuit board is provided with at least one first pad region, and a first pad region comprises a hollowed region penetrating through the adapter circuit board and a plurality of first pads distributed around the hollowed region; and the main circuit board is provided with at least one second pad region, a second pad region comprises a plurality of second pads, and the plurality of first pads of each first pad region are respectively soldered to the plurality of second pads of a corresponding second pad region;

wherein each first pad is provided with a solder hole penetrating through the adapter circuit board and filled with solder, and the solder connects the first pads and the second pads.

2. The circuit board according to claim 1, wherein the plurality of first pads surrounding the first pad region on the main circuit board are provided with a first underfill, a second underfill is provided in the hollowed region along a circumferential edge of the hollowed region, and both the first underfill and the second underfill are partially filled between the adapter circuit board and the main circuit board.

3. The circuit board according to claim 1, wherein a shape of the hollowed region is rectangular, circular or elliptical.

4. The circuit board according to claim 3, wherein a shape formed by distribution of the plurality of first pads in the first pad region is the same as the shape of the hollowed region.

5. The circuit board according to claim 1, wherein the adapter circuit board comprises a first underlay substrate and a first wiring layer and a second wiring layer respectively disposed on two sides of the first underlay substrate, wherein the first wiring layer comprises a plurality of first sub-pads, the second wiring layer comprises a plurality of second sub-pads having positions corresponding to positions of the first sub-pads, and the first pads comprise the first sub-pads and the second sub-pads which are connected through via holes plated with a conductive layer, wherein the via holes are the solder holes.

6. The circuit board according to claim 1, wherein the adapter circuit board is provided with a first lead group comprising a plurality of first leads extending along a first direction; the main circuit board is provided with a second lead group comprising a plurality of second leads extending along a second direction, and the first direction intersects with the second direction; an orthographic projection of the plurality of first leads on the main circuit board intersects with an orthographic projection of the plurality of second leads on the main circuit board.

7. The circuit board according to claim 6, wherein the adapter circuit board is provided with two first pad regions, each of the first leads connects two first pads located in the two first pad regions respectively, and the main circuit board is provided with two second pad regions corresponding to the two first pad regions respectively;

the main circuit board is further provided with a first device overlap region and a first external pin region, wherein the first external pin region comprises a first sub-external pin group, a second sub-external pin group and a third sub-external pin group, wherein each sub-external pin group comprises a plurality of first external pins, and the first device overlap region comprises a plurality of first overlap pins; and the circuit board is provided with a first signal lead group comprising a plurality of first signal leads, each of the first signal leads comprises a third lead, the first lead and a fourth lead which are connected in sequence, wherein two ends of the third lead are respectively connected with a first external pin of the first sub-external pin group and a second pad of one of the two second pad regions, and two ends of the fourth lead are respectively connected to a second pad of the other one of the two second pad regions and a first overlap pin.

8. The circuit board according to claim 7, wherein the first device overlap region further comprises a plurality of second overlap pins, the circuit board is further provided with a second signal lead group comprising a plurality of second signal leads, and two ends of a second signal lead are respectively connected with a first external pin of the second sub-external pin group and a second overlap pin.

9. The circuit board according to claim 7, wherein the main circuit board is further provided with a second external pin region comprising a plurality of second external pins, and the second leads are connected with the first external pins of the third sub-external pin group and the second external pins.

10. The circuit board according to claim 9, wherein the main circuit board is further provided with a second device overlap region, and part of the second leads in the second lead group are further connected with the second device overlap region.

11. A display panel comprising a display substrate and a circuit board, and the circuit board is bond and connected with the display substrate, and the circuit board comprises a main circuit board and an adapter circuit board stacked on the main circuit board;

the adapter circuit board is provided with at least one first pad region, and a first pad region comprises a hollowed region penetrating through the adapter circuit board and a plurality of first pads disposed around the hollowed region; and the main circuit board is provided with at least one second pad region, a second pad region comprises a plurality of second pads, and the plurality of first pads of each of the first pad regions are respectively soldered to the plurality of second pads of a corresponding second pad region;

wherein each first pad is provided with a solder hole penetrating through the adapter circuit board and filled with solder, and the solder connects the first pads and the second pads.

12. The display panel of claim 11, wherein the plurality of first pads surrounding the first pad region on the main circuit board are provided with first a underfill, a second underfill is provided in the hollowed region along a circumferential edge of the hollowed region, and both the first underfill and the second underfill are partially filled between the adapter circuit board and the main circuit board.

13. The display panel of claim 11, wherein a shape of the hollowed region is rectangular, circular or elliptical.

14. The display panel of claim 13, wherein a shape formed by distribution of the plurality of first pads in the first pad region is the same as the shape of the hollowed region.

15. The display panel of claim 11, wherein the adapter circuit board comprises a first underlay substrate and a first layer and a second wiring layer respectively disposed on two sides of the first underlay substrate, wherein the first wiring layer comprises a plurality of first sub-pads, the second wiring layer comprises a plurality of second sub-pads having positions corresponding to positions of the first sub-pads, and the first pads comprise the first sub-pads and the second sub-pads which are connected through via holes plated with a conductive layer, and the via holes are the solder holes.

16. The display panel of claim 11, wherein the adapter circuit board is provided with a first lead group comprising a plurality of first leads extending along a first direction; the main circuit board is provided with a second lead group comprising a plurality of second leads extending along a second direction, and the first direction intersects with the second direction; an orthographic projection of the plurality of first leads on the main circuit board intersects with an orthographic projection of the plurality of second leads on the main circuit board.

17. The display panel of claim 16, wherein the adapter circuit board is provided with two first pad regions, each of the first leads connects two first pads located in the two first pad regions respectively, and the main circuit board is provided with two second pad regions corresponding to the two first pad regions respectively;
- the main circuit board is further provided with a first device overlap region and a first external pin region, wherein the first external pin region comprises a first sub-external pin group, a second sub-external pin group and a third sub-external pin group, wherein each sub-external pin group comprises a plurality of first external pins, and the first device overlap region comprises a plurality of first overlap pins; and
- the circuit board is provided with a first signal lead group comprising a plurality of first signal leads, each of the first signal leads comprises a third lead, the first lead and a fourth lead which are connected in sequence, wherein two ends of the third lead are respectively connected with a first external pin of the first sub-external pin group and a second pad of one of the two second pad regions, and two ends of the fourth lead are respectively connected to a second pad of the other one of the two second pad regions and the first overlap pin.

18. A display apparatus, which comprises a display panel comprising a display substrate and a circuit board, and the circuit board is bond and connected with the display substrate, and the circuit board comprises a main circuit board and an adapter circuit board stacked on the main circuit board;
- the adapter circuit board is provided with at least one first pad region, and a first pad region comprises a hollowed region penetrating through the adapter circuit board and a plurality of first pads distributed around the hollowed region; and
- the main circuit board is provided with at least one second pad region, and a second pad region comprising a plurality of second pads, and the plurality of first pads of each of the first pad regions are respectively soldered with the plurality of second pads of a corresponding second pad region;
- wherein each first pad is provided with a solder hole penetrating through the adapter circuit board and filled with solder, and the solder connects the first pads and the second pads.

* * * * *